(12) United States Patent
Ohata

(10) Patent No.: US 12,140,825 B2
(45) Date of Patent: Nov. 12, 2024

(54) OPTICAL COMMUNICATION DEVICE AND TRANSMISSION MODULE

(71) Applicant: Mitsubishi Electric Corporation, Tokyo (JP)

(72) Inventor: Nobuo Ohata, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 262 days.

(21) Appl. No.: 17/518,830

(22) Filed: Nov. 4, 2021

(65) Prior Publication Data

US 2022/0057660 A1 Feb. 24, 2022

Related U.S. Application Data

(63) Continuation of application No. PCT/JP2019/022744, filed on Jun. 7, 2019.

(51) Int. Cl.
*G02F 1/025* (2006.01)
*G02F 1/01* (2006.01)
(Continued)

(52) U.S. Cl.
CPC ............ *G02F 1/025* (2013.01); *G02F 1/0121* (2013.01); *G02F 1/0157* (2021.01); *H01S 5/022* (2013.01);
(Continued)

(58) Field of Classification Search
CPC ...... G02F 1/0157; G02F 1/0356; G02F 1/025; G02F 1/0121; H01S 5/022; H04B 10/503; H04B 10/505
See application file for complete search history.

(56) References Cited

U.S. PATENT DOCUMENTS

2004/0202397 A1 10/2004 Hatta et al.
2005/0063651 A1 3/2005 Hamasaki et al.
(Continued)

FOREIGN PATENT DOCUMENTS

JP 2001-257435 A 9/2001
JP 2004-317556 A 11/2004
(Continued)

OTHER PUBLICATIONS

Akiyama et al., Machine Translation of JP-6037952-B2, Dec. 2016. (Year: 2016).*
(Continued)

*Primary Examiner* — Michelle R Connelly
(74) *Attorney, Agent, or Firm* — Birch, Stewart, Kolasch & Birch, LLP

(57) ABSTRACT

An optical communication device is configured to include: a laser diode that outputs light; an EA modulator including a cathode and an anode, to modulate the light output from the laser diode on the basis of a high-frequency signal applied between the cathode and the anode; a resistor connected between the cathode and the anode; and a pattern line connected in series with the resistor and having an
(Continued)

inductance component, in which each of the laser diode and the EA modulator is formed on a front surface of the high-frequency line substrate or a back surface of the high-frequency line substrate, and the pattern line is formed on a side face of the high-frequency line substrate.

6 Claims, 5 Drawing Sheets

(51) Int. Cl.
  *G02F 1/015* (2006.01)
  *H01S 5/022* (2021.01)
  *H04B 10/50* (2013.01)
(52) U.S. Cl.
  CPC ......... *H04B 10/503* (2013.01); *H04B 10/505* (2013.01)

(56) References Cited

U.S. PATENT DOCUMENTS

2006/0215969 A1 9/2006 Hamasaki et al.
2007/0248363 A1 10/2007 Kagaya
2008/0118202 A1* 5/2008 Kato ................ G02B 6/12004
  385/14
2017/0012700 A1 1/2017 Hosokawa et al.
2018/0275434 A1 9/2018 Tanaka

FOREIGN PATENT DOCUMENTS

| JP | 2005-43622 A | 2/2005 | |
| JP | 3975786 B2 * | 9/2007 | ............ G02F 1/025 |
| JP | 2007-286454 A | 11/2007 | |
| JP | 2015143765 A * | 8/2015 | ............ G02F 1/225 |
| JP | 2016-181543 A | 10/2016 | |
| JP | 6037952 B2 * | 12/2016 | |
| JP | 2018-156032 A | 10/2018 | |

OTHER PUBLICATIONS

Kato et al., Machine Translation of JP-3975786-B2, Sep. 2007. (Year: 2007).*
Hosokawa et al., Machine Translation of JP-2015143765-A, Aug. 2015. (Year: 2015).*
International Search Report, issued in PCT/JP2019/022744, PCT/ISA/210, dated Jul. 23, 2019.
Notice of Reasons for Refusal for Japanese Application No. 2019-565352, dated Jan. 7, 2020.
Chinese Office Action and Search Report dated Dec. 27, 2023 for Application No. 201980097025.9 with an English translation.

* cited by examiner

——— EA Modulator Connected With Pattern Line 14
— — — EA Modulator Not Connected With Pattern Line 14

OPTICAL COMMUNICATION DEVICE AND TRANSMISSION MODULE

CROSS REFERENCE TO RELATED APPLICATIONS

This application is a Continuation of PCT International Application No. PCT/JP2019/022744 filed on Jun. 7, 2019, which is hereby expressly incorporated by reference into the present application.

TECHNICAL FIELD

The present invention relates to an optical communication device and a transmission module including an electroabsorption modulator that modulates light output from a laser diode on the basis of a high-frequency signal.

BACKGROUND ART

Patent Literature 1 below discloses an optical circuit in which a high-frequency transmission line and an electroabsorption modulator integrated with DFB Laser (EML) are combined. The EML is a distributed feedback laser in which an electroabsorption modulator (hereinafter, referred to as an "EA modulator") that modulates light is integrated.

The high-frequency transmission line disclosed in Patent Literature 1 includes a high-impedance line portion connected in parallel with an EA portion that is an electrode of the EA modulator.

CITATION LIST

Patent Literatures

Patent Literature 1: JP 2016-181543 A

SUMMARY OF INVENTION

Technical Problem

The high-impedance line portion disclosed in Patent Literature 1 has an inductance component. The inductance component of the high-impedance line portion disclosed in Patent Literature 1 contributes to expansion of a signal passband in the EA modulator.

However, since the high-impedance line portion is formed on the same plane as a plane on which the EA portion and the like are formed among a plurality of planes included in the high-frequency transmission line, there is a problem that the area of the plane on which the EA portion and the like are formed is large.

The present invention has been made to solve the above-described problem, and an object thereof is to obtain an optical communication device and a transmission module capable of widening a signal passband in an EA modulator, without increasing a front surface area of a high-frequency line substrate or a back surface area of the high-frequency line substrate.

Solution to Problem

The optical communication device according to the present invention is configured to include: a laser diode to output light; an electroabsorption modulator including a cathode and an anode, to modulate the light output from the laser diode on the basis of a high-frequency signal applied between the cathode and the anode, the anode being connected to a ground in a same plane; a resistor connected between the cathode and the anode; and a pattern line connected in series with the resistor and having an inductance component, in which each of the laser diode and the electroabsorption modulator is formed on a front surface of the high-frequency line substrate or a back surface of the high-frequency line substrate, and the pattern line is formed on a side face of the high-frequency line substrate so as to be perpendicular to the ground.

Advantageous Effects of Invention

According to the present invention, the optical communication device is configured so that each of the laser diode and the electroabsorption modulator is formed on the front surface of the high-frequency line substrate or the back surface of the high-frequency line substrate, and the pattern line is formed on the side face of the high-frequency line substrate. Therefore, the optical communication device according to the present invention can widen the signal passband in the EA modulator, without increasing the front surface area of the high-frequency line substrate or the back surface area of the high-frequency line substrate.

DESCRIPTION OF EMBODIMENTS

Hereinafter, in order to explain this invention in more detail, embodiments for carrying out this invention will be described with reference to the accompanying drawings.

First Embodiment

Figure 1:
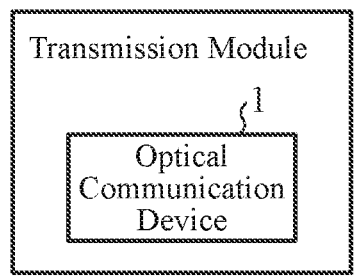
FIG. 1 is a configuration diagram illustrating a transmission module including an optical communication device 1 according to a first embodiment.

FIG. 1 is a configuration diagram illustrating a transmission module including an optical communication device 1 according to the first embodiment.

Figure 2:
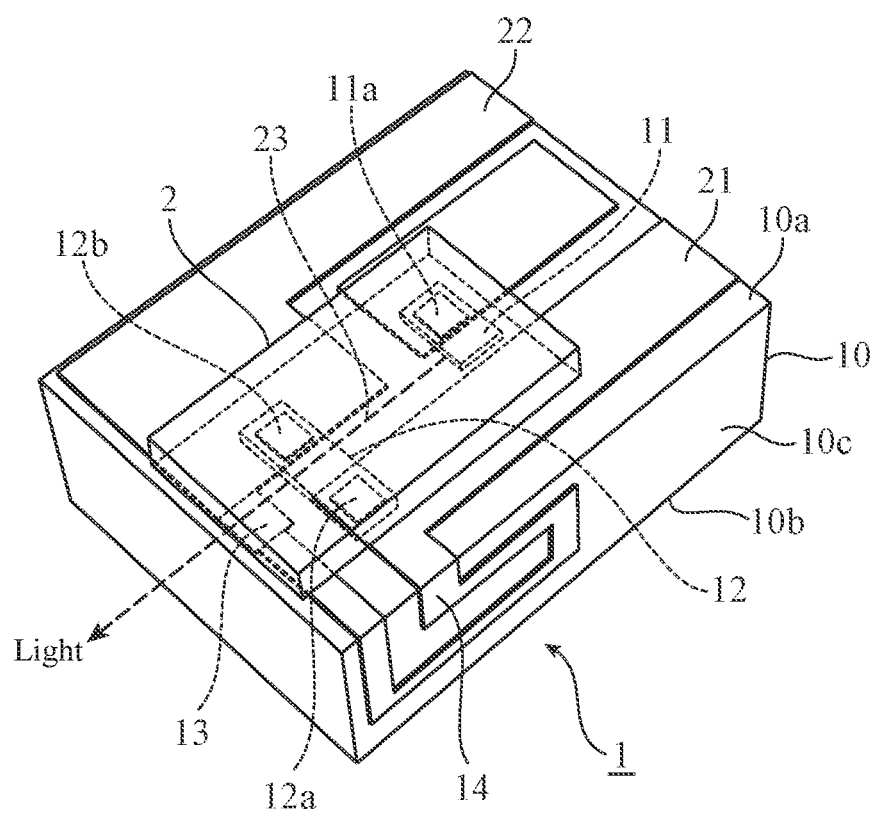
FIG. 2 is a perspective view illustrating the optical communication device 1 according to the first embodiment.

FIG. 2 is a perspective view illustrating the optical communication device 1 according to the first embodiment.

Figure 3:
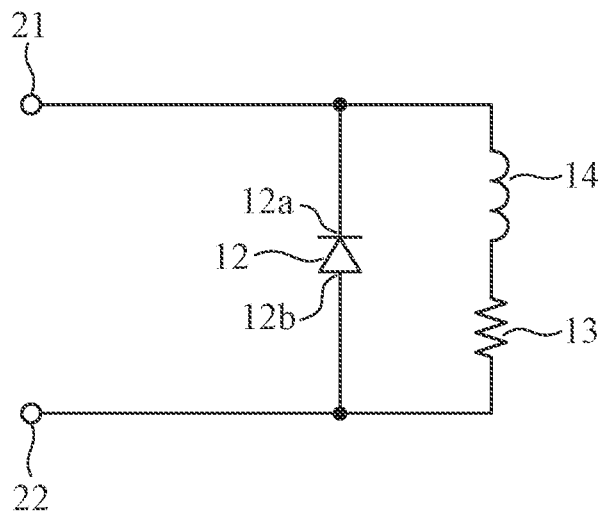
FIG. 3 is an equivalent circuit illustrating the optical communication device 1 according to the first embodiment.

FIG. 3 is an equivalent circuit illustrating the optical communication device 1 according to the first embodiment. The equivalent circuit illustrated in FIG. 3 does not include a laser diode 11 of the optical communication device 1.

In FIGS. 1 to 3, the transmission module includes the optical communication device 1, and transmits light modulated by an electroabsorption modulator (hereinafter, referred to as an "EA modulator") 12 included in the optical communication device 1.

The optical communication device 1 includes the laser diode 11, the EA modulator 12, a resistor 13, a pattern line 14, a signal line 21, a ground 22, and a waveguide 23.

An EML2 is a device that outputs modulated light, and the laser diode 11 and the EA modulator 12 are integrally formed.

In the optical communication device 1 illustrated in FIG. 2, the EML2 in which the laser diode 11 and the EA modulator 12 are integrally formed is illustrated. However, it is not limited to the case in which the laser diode 11 and the EA modulator 12 are integrally formed, and the laser diode 11 and the EA modulator 12 may be separate hardware.

A high-frequency line substrate 10 is a substrate on which the optical communication device 1 is mounted.

Among the components included in the optical communication device 1, each of the laser diode 11, the EA modulator 12, the resistor 13, the signal line 21, the ground 22, and the waveguide 23 is formed on a front surface 10a of the high-frequency line substrate 10.

In the optical communication device 1 illustrated in FIG. 1, each of the laser diode 11, the EA modulator 12, the resistor 13, the signal line 21, the ground 22, and the waveguide 23 is formed on the front surface 10a of the high-frequency line substrate 10. However, this is merely an example, and each of the laser diode 11, the EA modulator 12, the resistor 13, the signal line 21, the ground 22, and the waveguide 23 may be formed on a back surface 10b of the high-frequency line substrate 10.

Among the components included in the optical communication device 1, the pattern line 14 is formed on a side face 10c of the high-frequency line substrate 10.

Note that the resistor 13 may be formed not on the front surface 10a or the back surface 10b of the high-frequency line substrate 10 but on the side face 10c of the high-frequency line substrate 10.

The laser diode 11 has a positive-side electrode 11a and a negative-side electrode (not illustrated).

When a forward voltage is applied between the positive-side electrode 11a and the negative-side electrode, the laser diode 11 outputs a laser beam (hereinafter, referred to as "light").

The light output from the laser diode 11 reaches the EA modulator 12 through the waveguide 23.

The EA modulator 12 has a cathode 12a and an anode 12b.

The cathode 12a is connected to each of the signal line 21 that transmit a single-ended signal that is a high-frequency signal and another end of the pattern line 14.

The anode 12b is connected to each of the ground 22 and one end of the resistor 13.

The cathode 12a and the anode 12b are arranged at positions sandwiching the waveguide 23 through which the light output from the laser diode 11 passes.

The EA modulator 12 modulates the light output from the laser diode 11, on the basis of the high-frequency signal applied between the cathode 12a and the anode 12b.

When the signal level of the high-frequency signal is an H level, the EA modulator 12 absorbs the light output from the laser diode 11. Therefore, since the light output from the laser diode 11 does not pass through the EA modulator 12, the light is not output to the outside of the optical communication device 1. The signal level of the H level is, for example, a voltage of 1.5 [V].

On the other hand, when the signal level of the high-frequency signal is an L level, the EA modulator 12 does not absorb the light output from the laser diode 11. Therefore, since the light output from the laser diode 11 passes through the EA modulator 12, the light is output to the outside of the optical communication device 1. The signal level of the L level is, for example, a voltage of 0 [V].

The resistor 13 is connected between the cathode 12a and the anode 12b. Specifically, one end of the resistor 13 is connected to each of the anode 12b and the ground 22, and the other end of the resistor 13 is connected to one end of the pattern line 14.

The resistor 13 is a termination resistor for achieving matching with the impedance seen from the cathode 12a to the outside of the optical communication device 1.

The pattern line 14 is connected in series with the resistor 13. Specifically, one end of the pattern line 14 is connected to the other end of the resistor 13, and the other end of the pattern line 14 is connected to each of the cathode 12a and the signal line 21.

The pattern line 14 is, for example, a conductor line in which a plurality of portions are bent at substantially right angles, and has an inductance component.

The signal line 21 is connected to each of the cathode 12a of the EA modulator 12 and the other end of the pattern line 14.

The signal line 21 is a line for transmitting a high-frequency signal to the cathode 12a.

The ground 22 is connected to each of the anode 12b of the EA modulator 12 and one end of the resistor 13.

The waveguide 23 is disposed between the cathode 12a and the anode 12b, and the light output from the laser diode 11 passes therethrough.

Next, an operation of the optical communication device 1 illustrated in FIG. 2 will be described.

When a forward voltage is applied between the positive-side electrode 11a and the negative-side electrode, the laser diode 11 outputs light toward the EA modulator 12.

The light output from the laser diode 11 reaches the EA modulator 12 through the waveguide 23.

The signal line 21 transmits the high-frequency signal to the cathode 12a of the EA modulator 12.

When the signal level of the high-frequency signal is the H level, the EA modulator 12 absorbs the light output from the laser diode 11. Therefore, since the light output from the laser diode 11 does not pass through the EA modulator 12, the light is not output to the outside of the optical communication device 1.

When the signal level of the high-frequency signal is the L level, the EA modulator 12 does not absorb the light output from the laser diode 11. Therefore, since the light output from the laser diode 11 passes through the EA modulator 12, the light is output to the outside of the optical communication device 1.

The EA modulator 12 includes the cathode 12a and the anode 12b as electrodes, and the cathode 12a and the anode 12b are arranged to face each other, so that the EA modulator 12 can be regarded as a capacitor.

In the optical communication device 1 illustrated in FIG. 2, as illustrated in FIG. 3, since the EA modulator 12 that can be regarded as a capacitor and the pattern line 14 having an inductance component are connected in parallel, peaking occurs in the pass characteristic of the signal of the EA modulator 12.

In the optical communication device 1 illustrated in FIG. 2, peaking occurs in the pass characteristic of the signal of the EA modulator 12, so that the signal passband in the EA modulator 12 is wider than the signal passband in the EA modulator to which no inductance component is connected in parallel.

Figure 4:
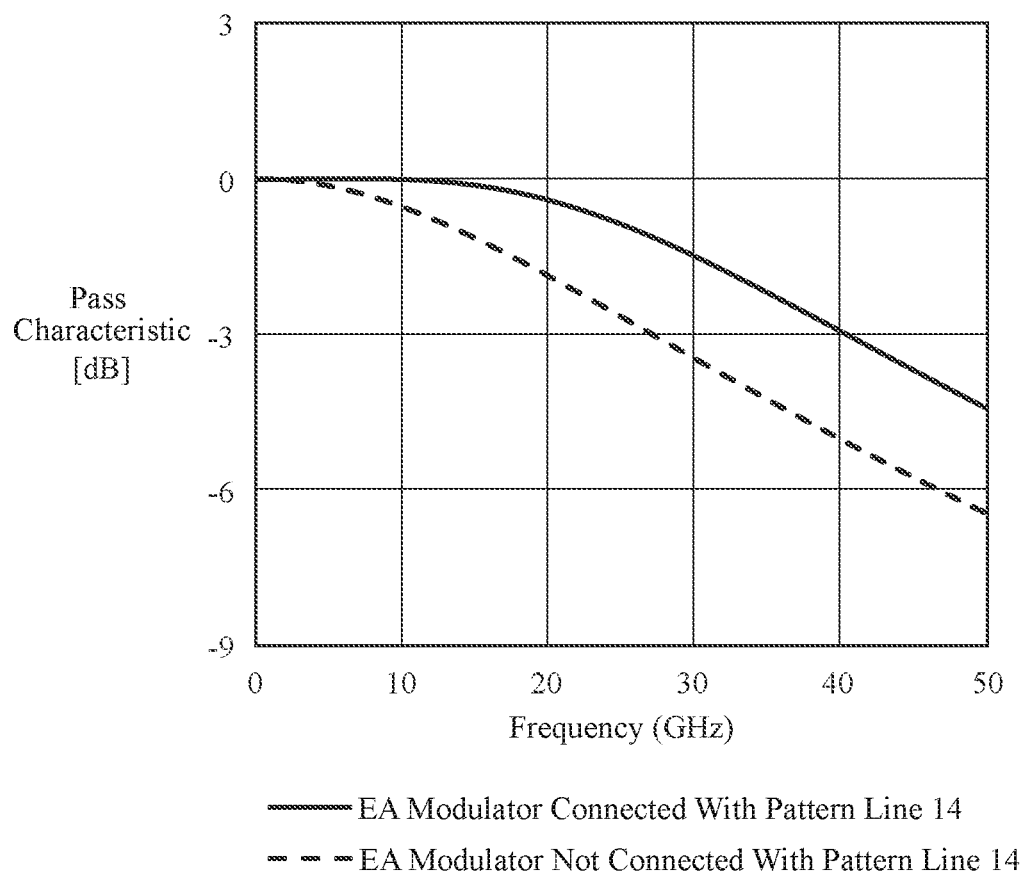
FIG. 4 is an explanatory diagram illustrating a simulation result of a signal passband in an EA modulator 12 included in the optical communication device 1 illustrated in FIG. 2.

FIG. 4 is an explanatory diagram illustrating a simulation result of a signal passband in the EA modulator 12 included in the optical communication device 1 illustrated in FIG. 2.

In FIG. 4, the horizontal axis represents the frequency [GHz] of the high-frequency signal, and the vertical axis represents the pass characteristic [dB] of the signal.

A solid line indicates a simulation result of the signal passband in the EA modulator 12 with which the pattern line 14 is connected in parallel.

A broken line indicates a simulation result of the signal passband in the EA modulator with which the pattern line 14 is not connected in parallel.

In the example of FIG. 4, over a frequency of 0 [GHz] to 50 [GHz], the EA modulator 12 with which the pattern line 14 is connected in parallel has a higher pass characteristic [dB] of a signal than that of the EA modulator with which the pattern line 14 is not connected in parallel.

For example, assuming that a band in which the pass characteristic [dB] of the signal is equal to or more than −3 [dB] is an available band, the available band of the EA modulator with which the pattern line 14 is not connected in parallel is a frequency range of 0 [GHz] to about 27 [GHz].

On the other hand, an available band of the EA modulator 12 with which the pattern line 14 is connected in parallel is a frequency range of 0 [GHz] to about 40 [GHz].

Therefore, the EA modulator 12 with which the pattern line 14 is connected in parallel has a wider signal passband than that of the EA modulator with which the pattern line 14 is not connected in parallel.

In the first embodiment described above, the optical communication device 1 is configured so that each of the laser diode 11 and the EA modulator 12 is formed on the front surface 10a of the high-frequency line substrate 10 or the back surface 10b of the high-frequency line substrate 10, and the pattern line 14 is formed on the side face 10c of the high-frequency line substrate 10. Therefore, the optical communication device 1 can widen the signal passband in the EA modulator 12, without increasing the area of the front surface 10a of the high-frequency line substrate 10 or the area of the back surface 10b of the high-frequency line substrate 10.

Second Embodiment

In the optical communication device 1 of the first embodiment, the high-frequency signal applied between the cathode 12a and the anode 12b of the EA modulator 12 is a single-ended signal.

In the second embodiment, an optical communication device 1 in which a high-frequency signal applied between the cathode 12a and the anode 12b of the EA modulator 12 is a differential signal will be described.

FIG. 5 is a perspective view illustrating the optical communication device 1 according to the second embodiment.

Figure 5A:
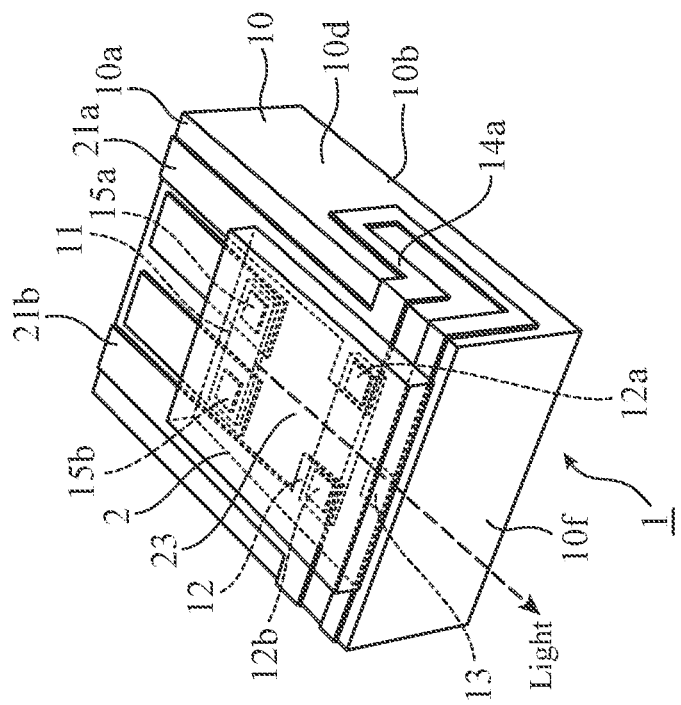
FIG. 5A is a perspective view illustrating an optical communication device 1 according to a second embodiment in which a second side face 10e and a side face 10f of the optical communication device 1 are described to be visible.

FIG. 5A is illustrated so that a second side face 10e and a side face 10f of the optical communication device 1 are visible among four side faces of the high-frequency line substrate 10.

Figure 5B:
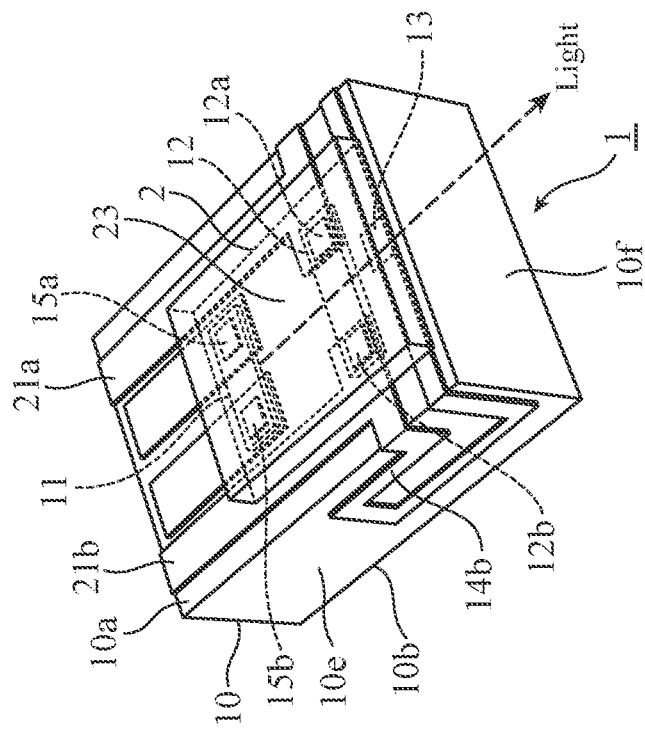
FIG. 5B is a perspective view illustrating the optical communication device 1 according to the second embodiment in which a first side face 10d and the side face 10f of the optical communication device 1 are described to be visible.

FIG. 5B is illustrated so that a first side face 10d and the side face 10f of the optical communication device 1 are visible among the four side faces of the high-frequency line substrate 10.

In FIGS. 5A and 5B, the same reference numerals as those in FIG. 2 denote the same or corresponding parts, and thus description thereof is omitted.

The optical communication device 1 illustrated in FIGS. 5A and 5B includes, as for the pattern line 14 illustrated in FIG. 2, a first pattern line 14a formed on the first side face 10d of the high-frequency line substrate 10 and a second pattern line 14b formed on the second side face 10e of the high-frequency line substrate.

One end of the first pattern line 14a is connected to one end of the resistor 13, and the other end of the first pattern line 14a is connected to each of the cathode 12a and a signal line 21a.

The first pattern line 14a is formed on the first side face 10d of the high-frequency line substrate 10.

The first pattern line 14a is, for example, a conductor line in which a plurality of portions are bent at substantially right angles, and has an inductance component.

Note that while the other end of the resistor 13 is connected to one end of the pattern line 14 in the optical communication device 1 illustrated in FIG. 2, one end of the resistor 13 is connected to one end of the first pattern line 14a in the optical communication device 1 illustrated in FIGS. 5A and 5B, for convenience of description.

One end of the second pattern line 14b is connected to each of the anode 12b and a signal line 21b, and the other end of the second pattern line 14b is connected to the other end of the resistor 13.

The second pattern line 14b is formed on the second side face 10e of the high-frequency line substrate 10.

The second pattern line 14b is, for example, a conductor line in which a plurality of portions are bent at substantially right angles, and has an inductance component.

The signal line 21a is connected to each of the cathode 12a of the EA modulator 12 and the other end of the first pattern line 14a.

The signal line 21a is a line for transmitting one signal in a differential signal that is a high-frequency signal to the cathode 12a.

The signal line 21b is connected to each of the anode 12b of the EA modulator 12 and one end of the second pattern line 14b.

The signal line 21b is a line for transmitting the other signal in the differential signal which is a high-frequency signal to the anode 12b.

The laser diode 11 has a cathode 15a and an anode 15b.

The laser diode 11 outputs a laser beam, when a voltage is applied between the cathode 15a and the anode 15b so that a constant current flows from the anode 15b to the cathode 15a.

The light output from the laser diode 11 reaches the EA modulator 12 through the waveguide 23.

Next, an operation of the optical communication device 1 illustrated in FIG. 5 will be described.

When a voltage is applied between the cathode 15a and the anode 15b so that a constant current flows from the anode 15b to the cathode 15a, the laser diode 11 outputs light toward the EA modulator 12.

The light output from the laser diode 11 reaches the EA modulator 12 through the waveguide 23.

The signal line 21a transmits a signal having a positive polarity in the differential signal that is a high-frequency signal to the cathode 12a.

The signal line 21b transmits a signal having a negative polarity in the differential signal that is a high-frequency signal to the anode 12b.

When the signal level of the signal obtained by subtracting the signal having the negative polarity from the signal having the positive polarity is the H level, the EA modulator 12 absorbs the light output from the laser diode 11. Therefore, since the light output from the laser diode 11 does not pass through the EA modulator 12, the light is not output to the outside of the optical communication device 1.

When the signal level of the signal obtained by subtracting the signal having the negative polarity from the signal having the positive polarity is the L level, the EA modulator 12 does not absorb the light output from the laser diode 11. Therefore, since the light output from the laser diode 11 passes through the EA modulator 12, the light is output to the outside of the optical communication device 1.

In the second embodiment described above, the optical communication device 1 is configured so that the first pattern line 14a is formed on the first side face 10d of the high-frequency line substrate 10, and the second pattern line 14b is formed on the second side face 10e of the high-frequency line substrate 10. Therefore, even when the high-frequency signal is a differential signal, the optical communication device 1 can widen the signal passband in the EA modulator 12. without increasing the area of the front surface 10a of the high-frequency line substrate 10 or the area of the back surface 10b of the high-frequency line substrate 10.

Third Embodiment

In the third embodiment, an optical communication device 1 including a capacitor 30 connected in series with the resistor 13 will be described.

Figure 6:
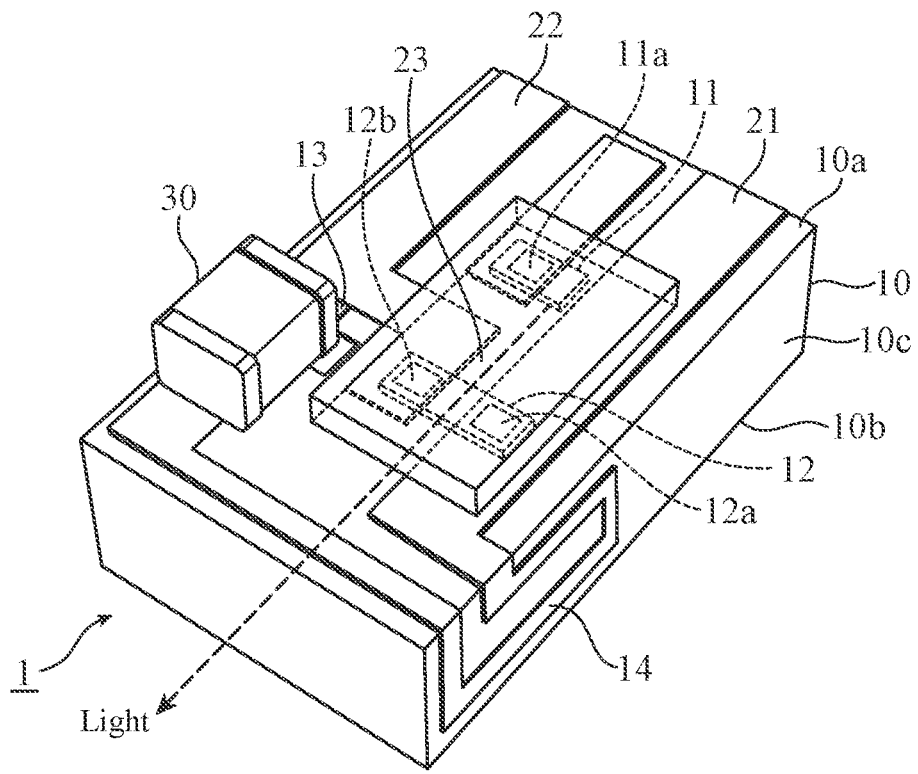
FIG. 6 is a perspective view illustrating an optical communication device 1 according to a third embodiment.

FIG. 6 is a perspective view illustrating the optical communication device 1 according to the third embodiment.

Figure 7:
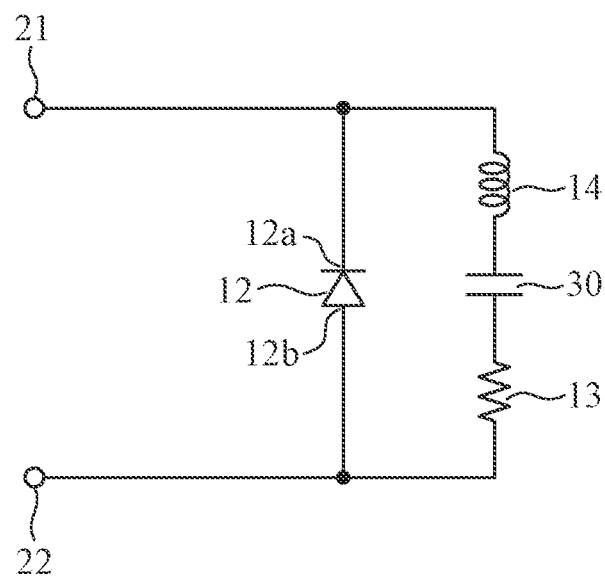
FIG. 7 is an equivalent circuit illustrating the optical communication device 1 according to the third embodiment.

FIG. 7 is an equivalent circuit illustrating the optical communication device 1 according to the third embodiment. The equivalent circuit illustrated in FIG. 7 does not include the laser diode 11 of the optical communication device 1.

In FIGS. 6 and 7, the same reference numerals as those in FIGS. 2 and 3 denote the same or corresponding parts, and thus description thereof is omitted.

The optical communication device 1 includes the laser diode 11, the EA modulator 12, the resistor 13, the pattern line 14, the signal line 21, the ground 22, the waveguide 23, and the capacitor 30.

The capacitor 30 is formed on the front surface 10a of the high-frequency line substrate 10.

The capacitor 30 is connected in series with the resistor 13.

In the optical communication device 1 illustrated in FIG. 6, as illustrated in FIG. 7, the capacitor 30 is connected between the resistor 13 and the pattern line 14. However, this is merely an example, and the capacitor 30 may be connected between the ground 22 and the resistor 13, or the capacitor 30 may be connected between the pattern line 14 and the signal line 21.

Note that, when each of the laser diode 11, the EA modulator 12, the resistor 13, the signal line 21, the ground 22, and the waveguide 23 is formed on the back surface 10b of the high-frequency line substrate 10, the capacitor 30 is also formed on the back surface 10b of the high-frequency line substrate 10.

Next, an operation of the optical communication device 1 illustrated in FIG. 6 will be described. Note that, since the components other than the capacitor 30 are similar to those of the optical communication device 1 illustrated in FIG. 2, the operation of the capacitor 30 will be mainly described here.

If the operating point of the EA modulator 12 needs to be adjusted before operating the EA modulator 12, a direct current bias may be applied between the cathode 12a and the anode 12b.

In the optical communication device 1 illustrated in FIG. 6, since the capacitor 30 is connected in series with the resistor 13, the capacitor 30 blocks the direct current flowing through the resistor 13.

Therefore, in the optical communication device 1 illustrated in FIG. 6, it is possible to reduce power consumption when the direct current bias is applied between the cathode 12a and the anode 12b in order to adjust the operating point of the EA modulator 12.

In the third embodiment described above, the optical communication device 1 is configured to include the capacitor 30 connected in series with the resistor 13. Therefore, the optical communication device 1 can widen the signal passband in the EA modulator 12, without increasing the area of the front surface 10a of the high-frequency line substrate 10 or the area of the back surface 10b of the high-frequency line substrate 10, and also can reduce the power consumption when adjusting the operating point of the EA modulator 12.

Fourth Embodiment

In the fourth embodiment, an optical communication device 1 in which the resistor 13 has an impedance different from the impedance seen from the cathode 12a of the EA modulator 12 to the outside of the optical communication device 1 will be described.

The configuration of the optical communication device 1 according to the fourth embodiment is illustrated in FIG. 1 similarly to the configuration of the optical communication device 1 according to the first embodiment.

In a case where an impedance seen from the cathode 12a of the EA modulator 12 to the outside of the optical communication device 1 is, for example, 50Ω, if the resistor 13 has an impedance of 50Ω, matching with the impedance seen to the outside of the optical communication device 1 can be achieved.

On the other hand, if the impedance of the resistor 13 is set to an impedance different from 50Ω, it is possible to adjust the pass characteristic [dB] of the signal in the EA modulator 12.

Figure 8:
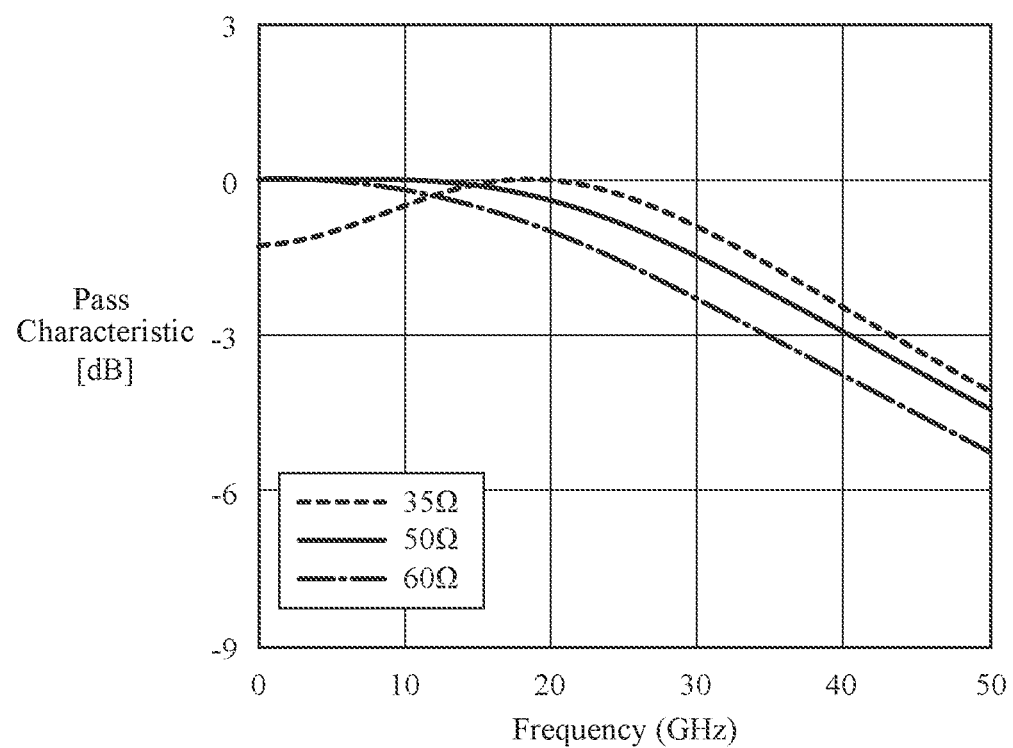
FIG. 8 is an explanatory diagram illustrating a simulation result of a signal passband in the EA modulator 12 in a case where the impedance of a resistor 13 is 35Ω, 50Ω, or 60Ω.

FIG. 8 is an explanatory diagram illustrating a simulation result of the signal passband in the EA modulator 12 when the impedance of the resistor 13 is 35Ω, 50Ω, or 60Ω.

In FIG. 8, a broken line indicates a simulation result of the signal passband in the EA modulator 12 when the impedance of the resistor 13 is 35Ω.

A solid line indicates a simulation result of the signal passband in the EA modulator 12 when the impedance of the resistor 13 is 50Ω.

An alternate long and short dash line indicates a simulation result of the signal passband in the EA modulator 12 when the impedance of the resistor 13 is 60Ω.

For example, in a case where it is assumed that a loss occurs in the power of the high-frequency signal in the optical communication device 1 or the transmission module on which the optical communication device 1 is mounted, if a resistor having an impedance of 35Ω is used as the resistor 13 instead of the resistor having an impedance of 50Ω, the pass characteristic [dB] of the signal can be changed.

If a resistor having an impedance of 35Ω is used as the resistor 13 instead of the resistor having an impedance of 50Ω, the pass characteristic [dB] of the signal deteriorates in the frequency band of 0 [GHz] to about 15 [GHz] as illustrated in FIG. 8. However, in a frequency band of about 15 [GHz] to 50 [GHz], the pass characteristic [dB] of the signal can be improved.

In addition, even when a resistor having an impedance of 60Ω is used as the resistor 13 instead of the resistor having an impedance of 50Ω, it is possible to change the pass characteristic [dB] of the signal over the frequency of 0 [GHz] to 50 [GHz].

Therefore, since the optical communication device 1 includes, as the resistor 13, a resistor having an impedance different from the impedance seen from the cathode 12a to the outside of the optical communication device 1, even when it is assumed that a loss occurs in the power of the high-frequency signal, a desired passband may be obtained.

It should be noted that the invention of the present application can freely combine the embodiments, modify any constituent element of each embodiment, or omit any constituent element in each embodiment within the scope of the invention.

INDUSTRIAL APPLICABILITY

The present invention is suitable for an optical communication device and a transmission module including an electroabsorption modulator that modulates light output from a laser diode on the basis of a high-frequency signal.

REFERENCE SIGNS LIST

1: optical communication device, 2: EML, 10: high-frequency line substrate, 10a: front surface, 10b: back surface, 10c, 10f: side face, 10d: first side face, 10e: second side face, 11: laser diode, 11a: electrode, 12: EA modulator, 12a: cathode, 12b: anode, 13: resistor, 14: pattern line, 14a: first pattern line, 14b: second pattern line, 15a: cathode, 15b: anode, 21, 21a, 21b: signal line, 22: ground, 23: waveguide, 30: capacitor.

The invention claimed is:

1. An optical communication device, comprising:
   a laser diode to output light;
   an electroabsorption modulator including a cathode and an anode, to modulate the light output from the laser diode on a basis of a high-frequency signal applied between the cathode and the anode, the anode being connected to a ground in a same plane;
   a resistor connected between the cathode and the anode; and
   a pattern line connected in series with the resistor and having an inductance component, wherein
   each of the laser diode and the electroabsorption modulator is formed on a front surface of a high-frequency line substrate or a back surface of the high-frequency line substrate,
   the pattern line is formed on a side face of the high-frequency line substrate so as to be perpendicular to the ground,
   the pattern line includes a first pattern line formed on a first side face of the high-frequency line substrate and a second pattern line formed on a second side face of the high-frequency line substrate,
   the first pattern line has a first end connected to a first end of the resistor and a second end connected to the cathode, and
   the second pattern line has a first end connected to the anode and a second end connected to a second end of the resistor.

2. The optical communication device according to claim 1, wherein the high-frequency signal is a single-ended signal.

3. The optical communication device according to claim 1, wherein
   the high-frequency signal is a differential signal.

4. The optical communication device according to claim 1, further comprising a capacitor connected in series with the resistor.

5. The optical communication device according to claim 1, wherein the resistor has an impedance different from an impedance seen from the cathode to the outside of the optical communication device.

6. A transmission module comprising the optical communication device according to claim 1, to transmit the light modulated by the electroabsorption modulator included in the optical communication device.

* * * * *